(12) United States Patent
Jain et al.

(10) Patent No.: US 7,752,582 B2
(45) Date of Patent: Jul. 6, 2010

(54) METHOD AND APPARATUS FOR DETERMINING ELECTRO-MIGRATION IN INTEGRATED CIRCUIT DESIGNS

(75) Inventors: Palkesh Jain, Karnataka (IN); Ajoy Mandal, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 285 days.

(21) Appl. No.: 11/941,927

(22) Filed: Nov. 17, 2007

(65) Prior Publication Data

US 2009/0132972 A1 May 21, 2009

(51) Int. Cl.
*G06F 17/50* (2006.01)
(52) U.S. Cl. .................... 716/5; 716/4; 716/6
(58) Field of Classification Search ................ 716/4–6
See application file for complete search history.

(56) References Cited

U.S. PATENT DOCUMENTS

| 5,410,490 | A * | 4/1995 | Yastrow .................... 716/5 |
| 7,146,588 | B1 * | 12/2006 | Marathe et al. ............ 716/4 |
| 7,197,730 | B1 * | 3/2007 | Goda et al. ................ 716/4 |

OTHER PUBLICATIONS

Liu et al., "Design Tools for Reliablity Analysis", DAC 2006, Jul. 24-28, 2006, San Francisco, CA, USA, pp. 182-187.*

Barsky et al., "Electromigration-dependent parametric yield estimation", Proceedings of the 2004 11th IEEE International Conference on Electronics, Circuits and Systems, Dec. 13-15, 2004, pp. 121-124.*

\* cited by examiner

*Primary Examiner*—Jack Chiang
*Assistant Examiner*—Brandon W Bowers
(74) *Attorney, Agent, or Firm*—Dawn V. Stephens; Wade James Brady, III; Frederick J. Telecky, Jr.

(57) ABSTRACT

A method and apparatus for determining electro-migration (EM) in integrated circuit designs is disclosed. In one embodiment, a method includes pre-characterizing an output current waveform for a logic cell of the circuit at selected load and input slew points, estimating an effective load and operating slews at a chip level of the circuit and directly generating an equivalent current source waveform at output, evaluating current densities through a metal segment of the circuit using a fast solver, parametrically representing process variations and a netlist to parametrically model the interconnect variations of the circuit, and determining current densities for selected yield numbers using a parametrically generated current source on an interconnect network, wherein calculated results statistically predict a point of current density less than 9–σ a through any metal segment in the parametrically modeled circuit. The method may further include comparing selected current densities with predetermined EM guidelines.

19 Claims, 6 Drawing Sheets

US 7,752,582 B2

METHOD AND APPARATUS FOR DETERMINING ELECTRO-MIGRATION IN INTEGRATED CIRCUIT DESIGNS

FIELD OF THE INVENTION

The present invention relates to integrated circuit design, and more specifically to a method and apparatus for determining electro-migration in integrated circuit designs.

BACKGROUND

Electro-migration (EM) generally refers to transport of material caused by gradual movement of ions in a conductor due to momentum transfer between conducting electrons and diffusing metal atoms. Effects of EM may be important, for example, in applications where high direct current densities are used, such as in microelectronics and related structures. Physical and electrical properties of the structure may impact the EM. Additionally, as structure size decreases, practical significance of the EM effect increases. For this reason, it may be useful to both circuit and physical designers to check EM to predict circuitry viability.

EM checking typically involves calculating an average and root-mean-square (RMS) current through a metal segment. Simulation Program with Integrated Circuit Emphasis (SPICE) simulations of a driver cell with a model of an interconnect may be used. These simulations, however, may be generally characterized as a "brute force" way of current determination. Stated differently, the aforementioned checking is based on a worst case approach, where only worse case scenarios are calculated. For example, a worst case scenario of current density is checked against EM guidelines.

Further, the aforementioned techniques may begin to break down as the number of interconnects start to increase. Typically, a complex IO may have more than one hundred thousand un-reduced parasitics, each of which needs to be checked against EM rules. Thus, it may become impractical to perform complete SPICE simulation for top level macros.

As the number of chip level interconnects touches the billion number mark, attempts to check were made using methods which resulted in run-time reductions. These methods, however, may have resulted in compromised accuracy.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

A method and apparatus for determining electro-migration (EM) in integrated circuit designs is disclosed. In the following description, for purposes of explanation, numerous specific details are set forth in order to provide a thorough understanding of the various embodiments. It will be evident, however, to one skilled in the art that the various embodiments may be practiced without these specific details.

Figure 1:
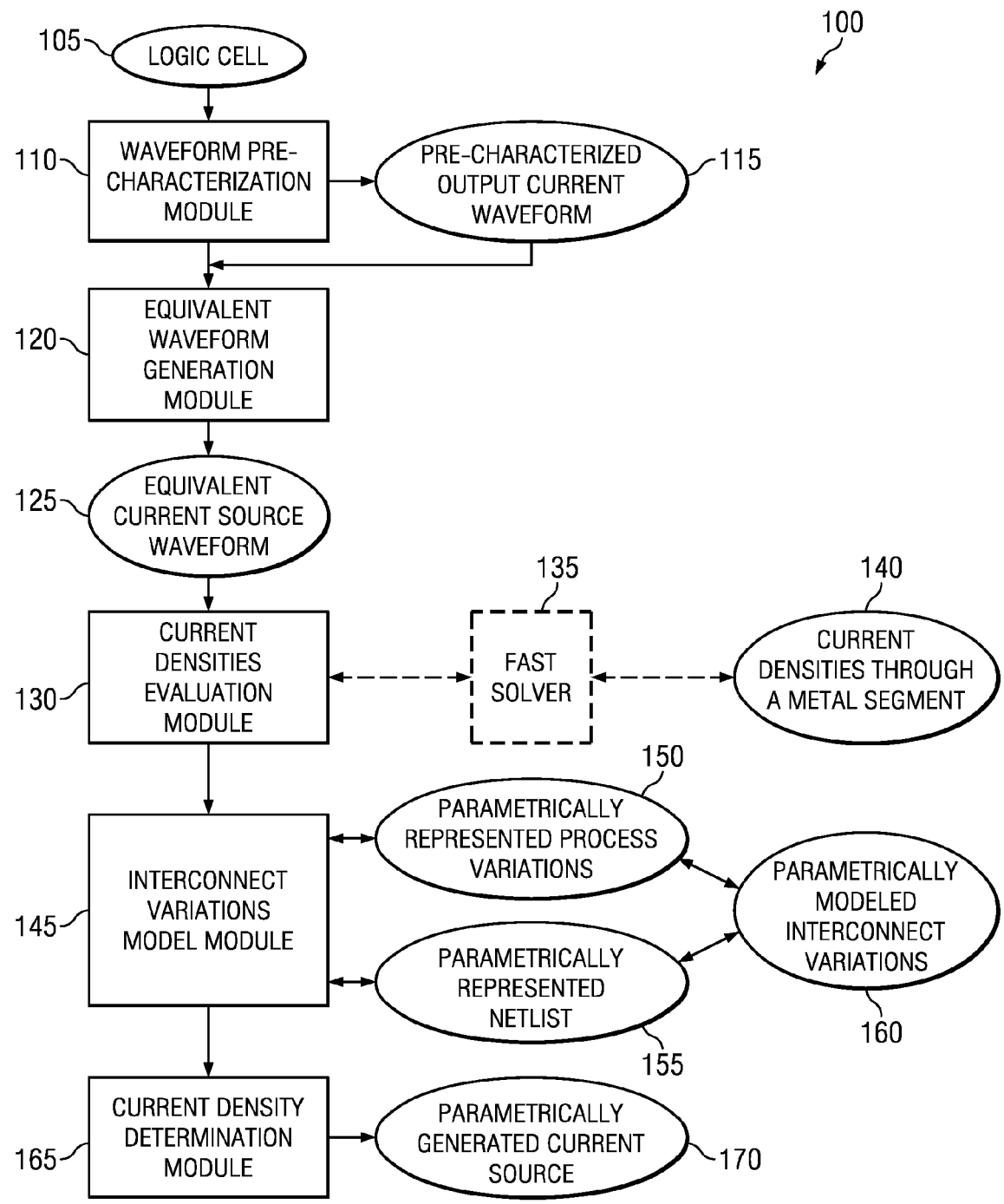
FIG. 1 is a block diagram illustrating quantification of design risk associated with electro-migration (EM) in metal leads of a circuit, according to one embodiment.

FIG. 1 is a block diagram 100 illustrating quantification of design risk associated with EM in metal leads of a circuit, according to one embodiment. Particularly, FIG. 1 illustrates a logic cell 105, a waveform pre-characterization module 110, an equivalent waveform generation module 120, a current densities evaluation module 130, a fast solver 135, an interconnect variations model module 145 and a current density destination module 165.

In operation, the waveform pre-characterization module 110 pre-characterizes an output current waveform 115 for logic cell 105 of the circuit at selected load and input slew points. Using the pre-characterized output waveform 115, the equivalent waveform generation module 120 estimates an effective load and operating slews at a chip level of the circuit and directly generates an equivalent current source waveform 125 at output of the logic cell 105. In one embodiment, the equivalent current source waveform 125 is generated on-the-fly at the operating load and slew points. In some embodiments, the equivalent current source waveform 125 is implemented in a parameterized form as a function of standard normal distribution (SNDs) of statistical variables.

Further, the current densities evaluation module 130 evaluates current densities through a metal segment 140 of the circuit using a fast solver 135. For example, an Asymptotic Waveform Evaluator (AWE) kind of fast solver 135 (e.g., that can rely on moment-matching techniques to determine interconnect currents) and/or a fast SPICE simulator can be used to evaluate current densities through the metal segment 140 of the circuit in order to save run-time of an EM analysis. In addition, the interconnect variations model module 145 parametrically represents process variations 150 and a net list 155. In some embodiments, the process variation 150 and a net list 155 are parametrically represented to result parametrically modeled interconnect variations 160 of the circuit.

The current densities determination module 165 determines current densities for selected yield numbers using a parametrically generated current source 170 on an interconnect network. In some embodiments, calculated results statistically predict a point of current density less than 9–σ through any metal segment in the parametrically modeled circuit. In various embodiments, the calculated results statistically predict a point of current density of approximately 3–σ through any metal segment in the parametrically modeled circuit. Further, various aspects for determining EM in integrated design circuits are explained below with respect to FIG. 2.

Figure 2:
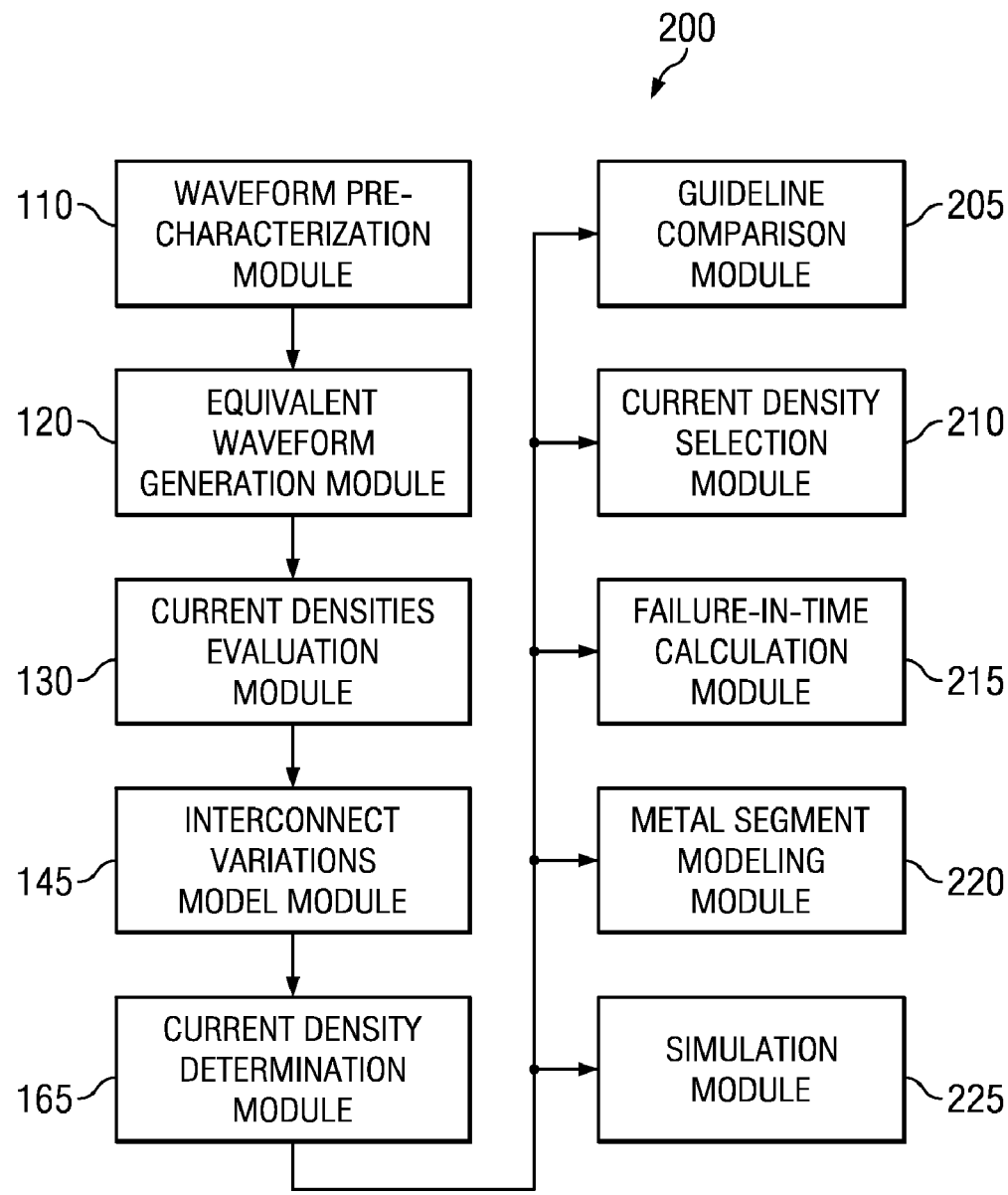
FIG. 2 is a block diagram illustrating additional modules associated with determination of EM in integrated circuit designs, according to one embodiment.

FIG. 2 is a block diagram 200 illustrating additional modules associated with determination of EM in integrated circuit designs, according to one embodiment. Particularly, FIG. 2 illustrates a guideline comparison module 205, a current density selection module 210, a Failure-In-Time calculation module 215, a metal segment modeling module 220 and a simulation module 225.

In operation, the guideline comparison module 205 compares selected current densities of the current densities with predetermined EM guidelines. The current densities selection module 210 selects a portion of the current densities which is used for calculating a Failure-In-Time rate by the Failure-In-Time calculation module 215. Further, the metal segment modeling module 220 parametrically models a metal segment current as a function of variables. Exemplary variables may include a transistor corner, input slews, interconnect and power supply voltage. In addition, in various aspects, the metal segment modeling module 220 parametrically models a metal segment current as a first equation:

$$J_{metal} = J_0 + \sum_{i=1}^{n} k_i P_i,$$

where $J_0$ is the current density through the metal segment at a nominal process, interconnect, and voltage and k is the sensitivity of the current density to the process, interconnect and voltage variations.

The simulation module 225 performs, for example, n+1 simulations to characterize the first equation on-the-fly. In some embodiments, calculated results statistically predict a point of current density of approximately 3–σ through any metal segment in the parametrically modeled circuit. In these embodiments, the calculated results is given by a second equation:

$$J_{metal-3-\sigma} = J_0 + 3 \times \sqrt{\left(\sum_{i=1}^{n} k_i^2\right)}$$

In some embodiments, the n+1 simulations may include approximately twelve simulations, performed to characterize sensitivities and nominal current density $J_0$. In these embodiments, a total of twelve simulations may be sufficient to estimate the 3–σ current density ($J_{3-\sigma}$) and then compare (e.g., using guideline comparison module 205) with the predetermined EM guidelines.

Figure 3:
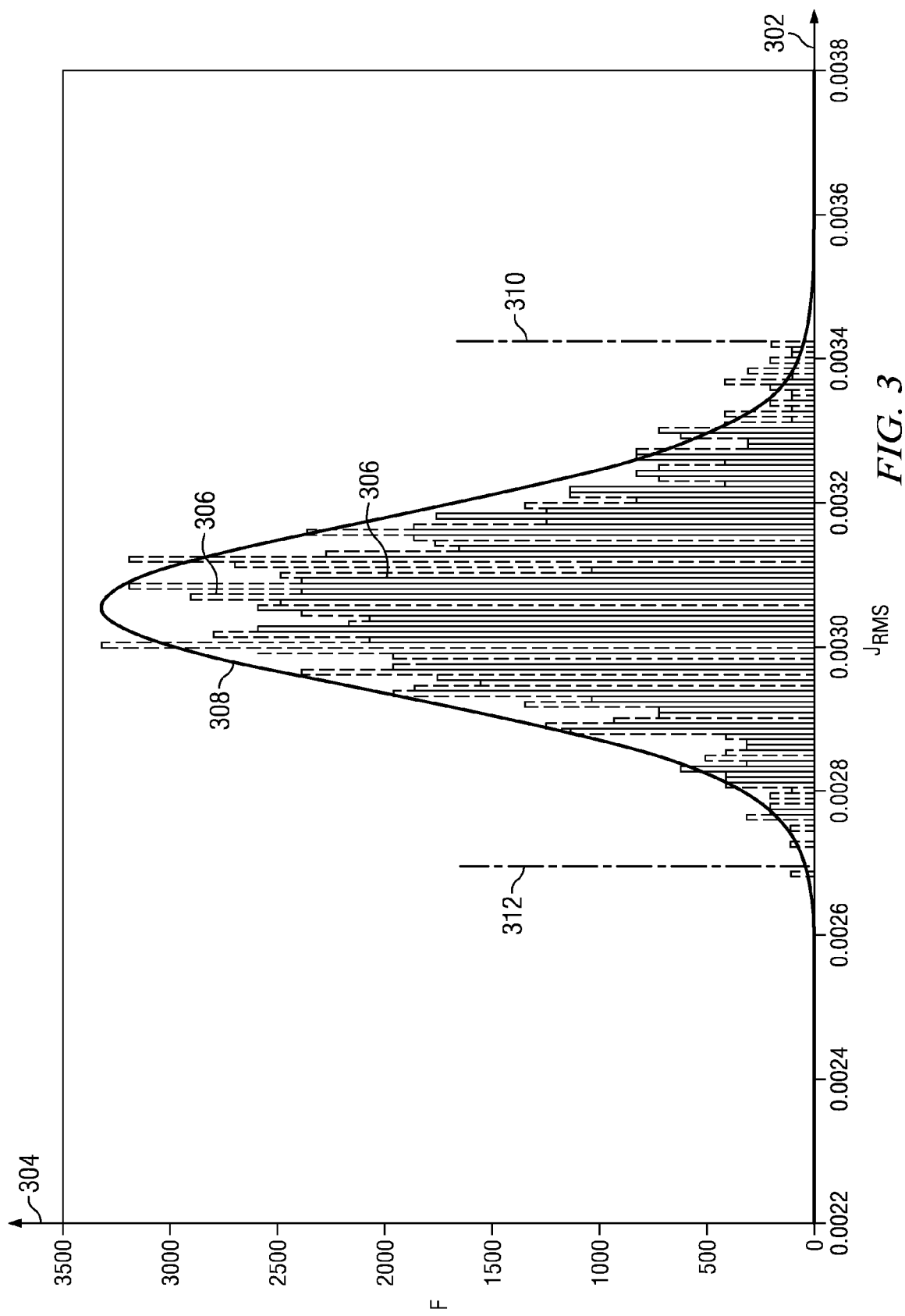
FIG. 3 is an exemplary graph illustrating current density distribution in a single metal segment, according to one embodiment.

FIG. 3 is an exemplary graph 300 illustrating current density distribution in a single metal segment, according to one embodiment. Particularly, FIG. 3 illustrates graphical representation of various current densities $J_{RMS}$ 306 estimated through the single metal segment in an integrated circuit and 3–σ values 310 and 312 respectively. The graph 300 represents frequency of occurrence (f) Vs current density ($J_{RMS}$). As illustrated in FIG. 3, current density ($J_{RMS}$) is plotted along X axis 302 (abscissa) and frequency (f) is plotted along Y axis 304 (ordinate). In addition, FIG. 3 illustrates the current densities 306 represented through a continuous line (i.e., res-dev-vdd.freq.adj), a distribution curve 308 represented through a dashed line (i.e., res-dev-vdd.csv.norm.adj), a positive 3–σ density value 310 represented through a line with a dash followed by double dots (i.e., res-dev-vdd.csv.norm.+3 sigma), a negative 3–σ density value 312 represented through a line with a dash followed by a dot (i.e., res-dev-vdd.cs-v.norm.–3sigma). In some embodiments, value of current densities illustrated in $J_{RMS}$ plot 300 is estimated from the first equation:

$$J_{metal} = J_0 + \sum_{i=1}^{n} k_i P_i$$

In these embodiments, a metal segment current is parametrically modeled as a function of process, interconnect and voltage variations and as the first equation. Further, in these embodiments, approximately twelve simulations are performed to characterize the first equation on-the-fly.

The Current density points 310 and 312 on the X axis 302 illustrate a positive and a negative 3–σ density values respectively, which are estimated based on the twelve simulations. In some embodiments, the calculated results that statistically predict a point of current density of approximately 3–σ through the single metal segment is given by the second equation:

$$J_{metal-3-\sigma} = J_0 + 3 \times \sqrt{\left(\sum_{i=1}^{n} k_i^2\right)}$$

In these embodiments, the 3–σ current densities 310 and 312 illustrated in the $J_{RMS}$ plot 300 are used for comparing with the predetermined EM guidelines and for calculating the FIT rate. Further, from the graph 300, it can be noted that the 3–σ density estimated through considering transistor, interconnect and voltage variations is $3.33e^{-3}$ units. Thus, through incorporating the process, voltage and interconnect variations, it is possible to obtain approximately 30% reduction in the 3–σ density. For example, 30% reduction in the 3–σ current densities may lower EM violations by 50%. Also, it can be noted that, in some aspects, approximately 20% reduction in worst case current densities may be obtained if only transistor and interconnect variations are considered. As a result, the final output may be entitled for higher performance due to reduction in the worst case current densities. Those skilled in the art will realize from the $J_{RMS}$ plot 300 that the calculated results of the EM analysis are within acceptable accuracy. Further, one skilled in the art will recognize that the range of improvement may vary as compared with this particular example.

Figure 4:
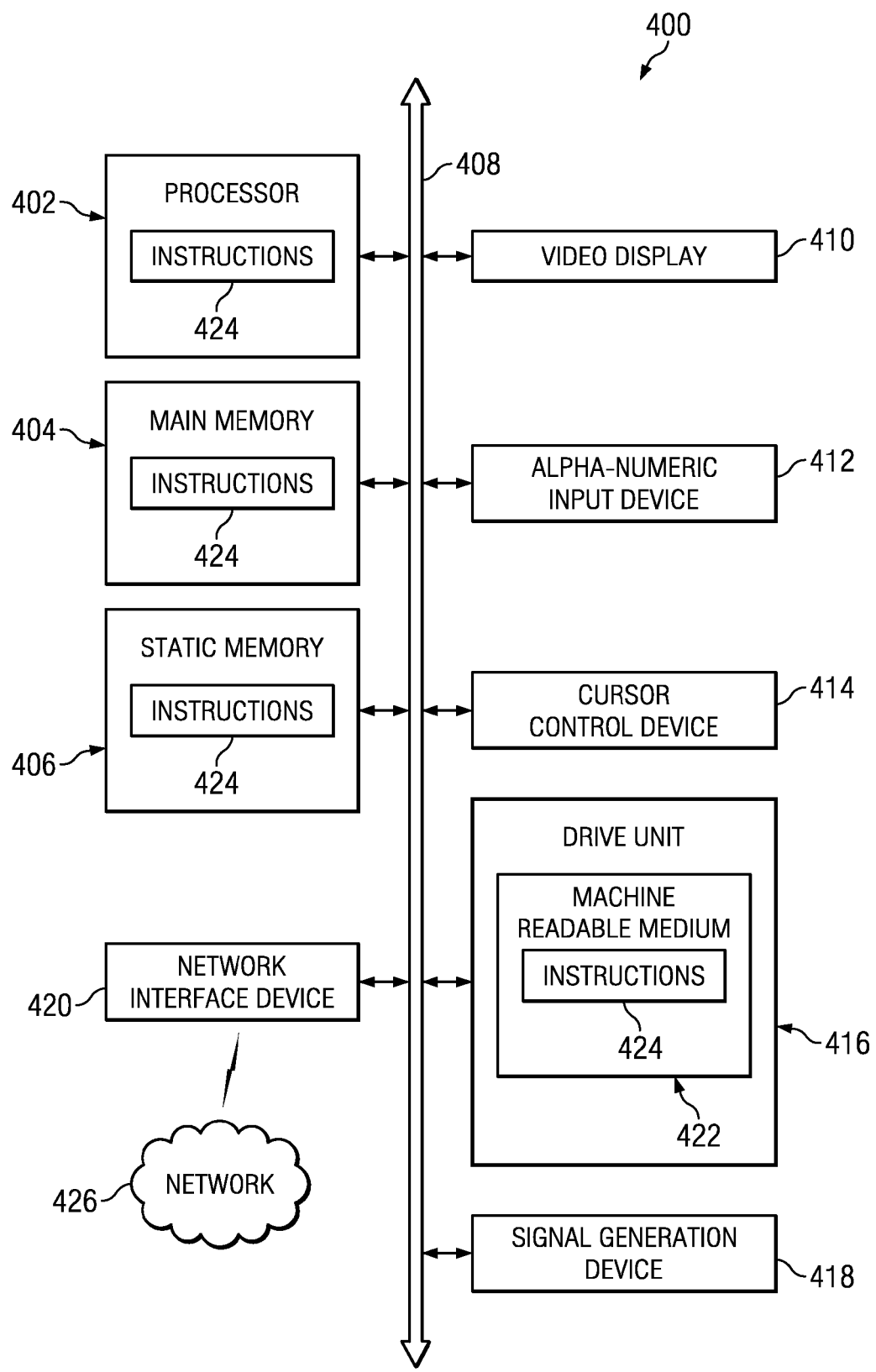
FIG. 4 is a diagrammatic system view of a data processing system in which any of the embodiments disclosed herein may be performed, according to one embodiment.

FIG. 4 is a diagrammatic system view 400 of a data processing system in which any of the embodiments disclosed herein may be performed, according to one embodiment. Particularly, the diagrammatic system view of FIG. 4 illustrates a processor 402, a main memory 404, a static memory 406, a bus 408, a video display 410, an alpha-numeric input device 412, a cursor control device 414, a drive unit 416, a signal generation device 418, a network interface device 420, a machine readable medium 422, instructions 424 and a network 426.

The diagrammatic system view 400 may indicate a personal computer and/or a data processing system in which one or more operations disclosed herein are performed. The processor 402 may be a microprocessor, a state machine, an application specific integrated circuit, a field programmable gate array, etc. The main memory 404 may be a dynamic random access memory and/or a primary memory of a computer system. The static memory 406 may be a hard drive, a flash drive, and/or other memory information associated with the data processing system.

The bus 408 may be an interconnection between various circuits and/or structures of the data processing system. The video display 410 may provide graphical representation of information on the data processing system. The alpha-numeric input device 412 may be a keypad, keyboard and/or any other input device of text (e.g., a special device to aid the physically handicapped). The cursor control device 414 may be a pointing device such as a mouse. The drive unit 416 may be a hard drive, a storage system, and/or other longer term storage subsystem.

The signal generation device 418 may be a bios and/or a functional operating system of the data processing system. The network interface device 420 may perform interface functions (e.g., code conversion, protocol conversion, and/or buffering) required for communications to and from the network 426 between a number of independent devices (e.g., of varying protocols). The machine readable medium 422 may provide instructions on which any of the methods disclosed herein may be performed. The instructions 424 may provide source code and/or data code to the processor 402 to enable any one or more operations disclosed herein.

For example, a quantification of design risk associated with EM in metal leads of a circuit using computer simulation models includes a first instruction set to pre-characterize (e.g., using the waveform pre-characterization module 110 of FIG. 1) an output current waveform 115 for a logic cell 105 of the circuit at selected load and input slew points, a second instruction set integrated with the first instruction set to estimate an effective load and operating slews at a chip level of the circuit and directly generating (e.g., through the equivalent current source waveform module 120 of FIG. 1) an equivalent current source waveform 125 at output, and a third instruction set integrated with the first instruction set and the second instruction set to evaluate (e.g., using the current densities evaluation module 130 of FIG. 1) current densities through a metal segment 140 of the circuit using the fast solver 135.

The quantification further includes a fourth instruction set integrated with the first instruction set, the second instruction set, and the third instruction set to parametrically represent (e.g., using the interconnect variations model module 145 of FIG. 1) process variations 150 and a netlist 155 to parametrically model the interconnect variations 160 of the circuit, and a fifth instruction set integrated with the first instruction set, the second instruction set, the third instruction set, and the fourth instruction set to determine (e.g., using the current densities determination module 165 of FIG. 1) current densities for selected yield numbers using a parametrically generated current source 170 on an interconnect network, wherein calculated results may statistically predict a point of current density less than 9–σ through any metal segment in the parametrically modeled circuit. Further, the calculated results may statistically predict a point of current density of approximately 3–σ through any metal segment in the parametrically modeled circuit.

The quantification may include a sixth instruction set to parametrically model (e.g., using the metal segment modeling module 220 of FIG. 2) the metal segment current as the first equation:

$$J_{metal} = J_0 + \sum_{i=1}^{n} k_i P_i$$

where $J_0$ is the current density through the metal segment at a nominal process, interconnect, and voltage and k is the sensitivity of the current density to process, interconnect, and voltage variations.

The quantification may include a seventh instruction to perform n+1 simulations (e.g., using the simulations module 225 of FIG. 2) to directly characterize the first equation, wherein calculated results statistically predict a point of current density of approximately 3–σ through any metal segment in the parametrically modeled circuit and in which the calculated results given by a second equation:

$$J_{metal-3-\sigma} = J_0 + 3 \times \sqrt{\left(\sum_{i=1}^{n} k_i^2\right)}$$

Figure 5A:
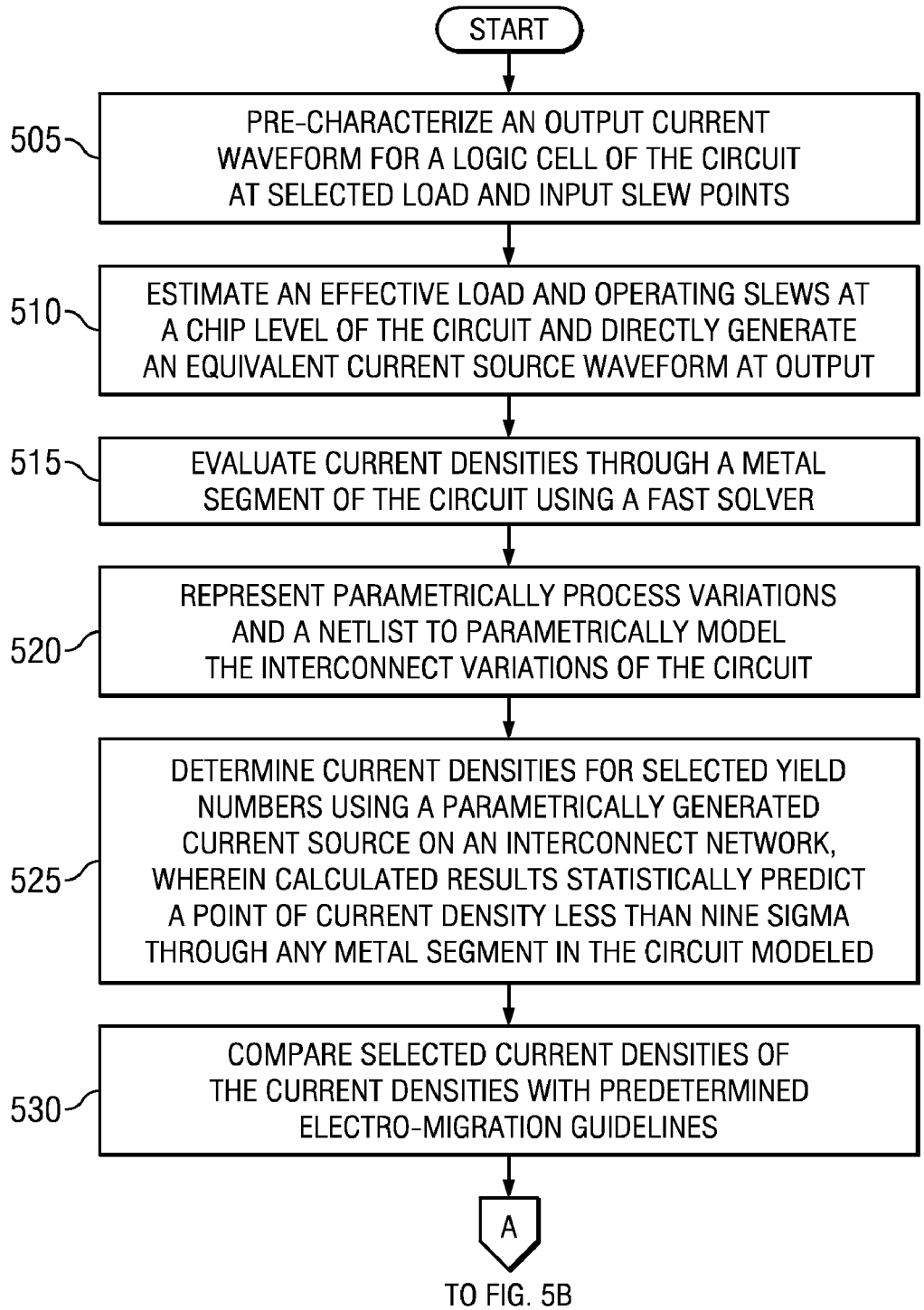
FIG. 5A is a process flow for determining EM in integrated circuit designs, according to one embodiment.

FIG. 5A is a process flow of determining EM in integrated circuit designs, according to one embodiment. In operation 505, an output current waveform is pre-characterized (e.g., using the waveform pre-characterization module 110 of FIG. 1) for a logic cell (e.g., the logic cell 105 of FIG. 1) of the circuit at selected load and input slew points.

In operation 510, an effective load and operating slews are estimated at a chip level of the circuit and an equivalent current source waveform (e.g., the equivalent current source waveform 125 of FIG. 1) is directly generated (e.g., using the equivalent waveform generation module 120 of FIG. 1) at output. In operation 515, current densities through a metal segment 140 of the circuit are evaluated (e.g., using the current densities evaluation module 130 of FIG. 1) using a fast solver (e.g., the fast solver 135 of FIG. 1).

In operation 520, process variations 150 and a netlist 155 are parametrically represented to parametrically model (e.g., using the interconnect variations model module 145 of FIG. 1) the interconnect variations of the circuit. In operation 525, current densities for selected yield numbers are determined (e.g., through the current density determination module 165 of FIG. 1) using a parametrically generated current source 170 on an interconnect network and wherein, calculated results statistically predict a point of current density less than 9–σ through any metal segment in the parametrically modeled circuit. In operation 530, selected current densities of the current densities are compared with the predetermined EM guidelines.

Figure 5B:
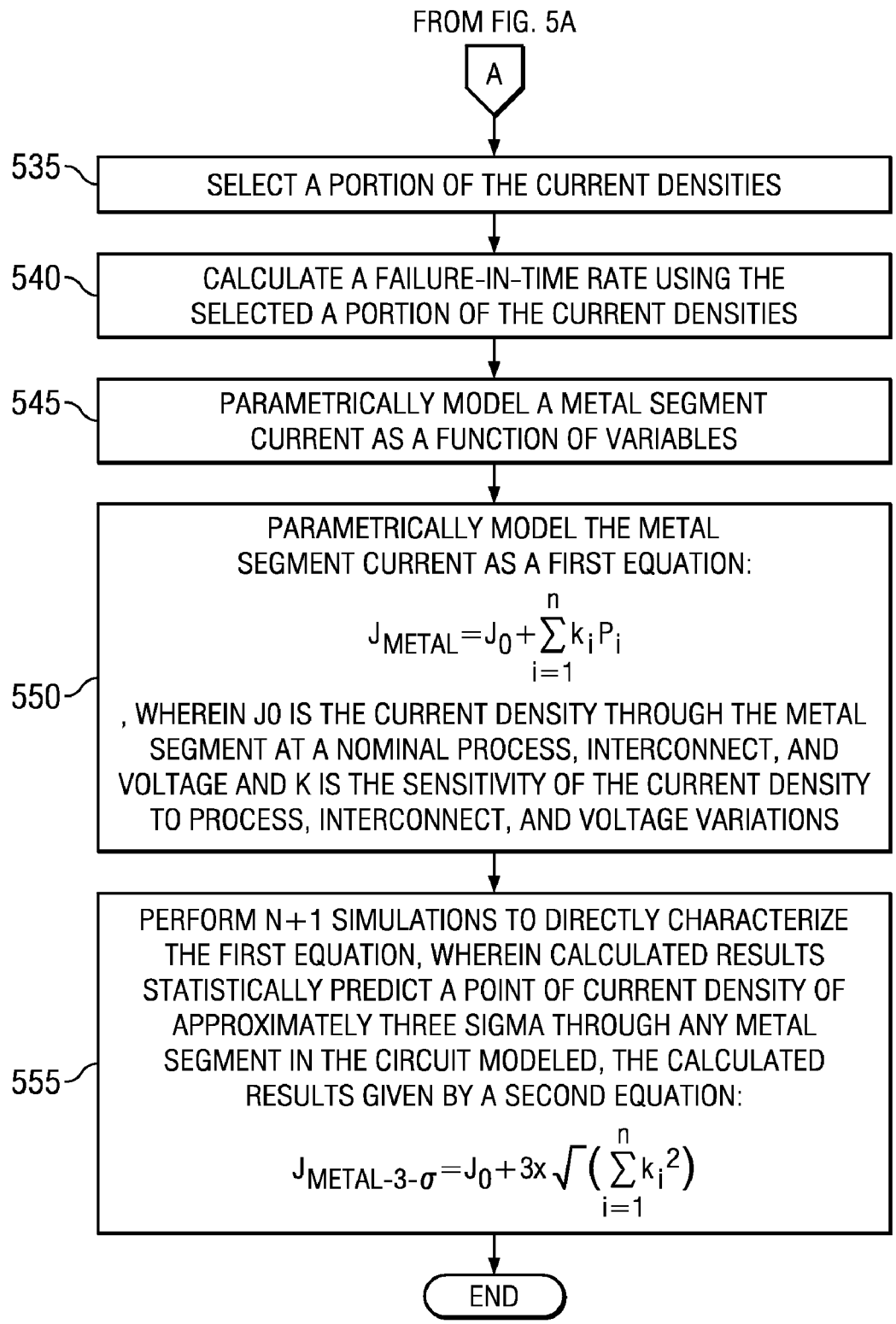
FIG. 5B is a continuation of the process flow of FIG. 5A, illustrating additional processes, according to one embodiment.

FIG. 5B is a continuation of the process flow of FIG. 5A, illustrating additional processes, according to one embodiment. In operation 535, a portion of the current densities is selected. In operation 540, a Failure-In-Time rate is calculated using the selected portion of the current densities. In operation 540, a metal segment current is parametrically modeled as a function of variables (e.g., transistor corner, input slews, interconnect and power supply voltage). In operation 545, the metal segment current is parametrically modeled as the first equation:

$$J_{metal} = J_0 + \sum_{i=1}^{n} k_i P_i$$

where $J_0$ is the current density through the metal segment at a nominal process, interconnect, and voltage and k is the sensitivity of the current density to process, interconnect, and voltage variations.

In operation 550, n+1 simulations are performed to directly characterize the first equation, and wherein calculated results statistically predict a point of current density of approximately 3-σ through any metal segment in the parametrically modeled circuit, the calculated results given by the second equation:

$$J_{metal-3-\sigma} = J_0 + 3 \times \sqrt{\left(\sum_{i=1}^{n} k_i^2\right)}$$

In one embodiment, the n+1 simulations may include approximately twelve simulations.

The above-described method uses pre-characterized current waveforms 115 for EM estimation. Such use may help in solving accuracy Vs run-time tradeoff in the EM analysis in the integrated circuit designs. In addition, the above-described technique solves the interconnect using the fast solver 135 (e.g., a fast AWE kind of solver).

Further, in the above-described technique, the pre-characterized current waveform 115 will be available as a timing suite at discrete load and slew points with same amount of IP required to interpolate between two load and slew points. In addition, variability flow will also have an interconnect and a current waveform parametrically modeled. Further, this flow may handle the variations in the substrate temperature when coupled with accurate representation of temperature in interconnects.

Further, the above-described technique incorporates variations (e.g., mainly process variations) by implementing an equivalent current source waveform 125 in parametric manner to permit fast variability analysis and also to provide 3-σ current densities through any metal segment. In some embodiments, the above-described technique can be implemented by parametrically representing the current density and characterizing the 3-σ current density on-the-fly by performing n+1 simulations (i.e., approximately twelve simulations). Also, the above-described technique is targeted towards a Failure-In-Time rate based checking. Additionally, the above-described technique may be lightweight on the infrastructure. The above-described framework permits re-using of dumped parametric slews.

In some embodiments, the final output may have an estimate of silicon integrity risk associated with EM violations and may be entitled for higher performance due to reduction in the worst case current densities.

The above-described method may be in a form of a machine-readable medium embodying a set of instructions that, when executed by a machine, causes the machine to perform any method disclosed herein. It will be appreciated that the various embodiments discussed herein may not be the same embodiment, and may be grouped into various other embodiments not explicitly disclosed herein.

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A machine readable medium embodying a set of instructions comprising the steps of:
   pre-characterizing an output current waveform for at least one logic cell of the circuit at selected load and input slew points;
   estimating an effective load and operating slews at a chip level of the circuit and directly generating an equivalent current source waveform at output;
   evaluating current densities through a metal segment of the circuit using a fast solver;
   parametrically representing process variations and a netlist to parametrically model the interconnect variations of the circuit; and
   using a parametrically generated current source on an interconnect network to determine current densities for selected yield numbers, wherein calculated results statistically predict a point of current density less than 9-σ through any metal segment in the parametrically modeled circuit.

2. The machine readable medium of claim 1, wherein the calculated results statistically predict a point of current density of approximately 3-σ through any metal segment in the parametrically modeled circuit.

3. The machine readable medium of claim 1, further comprising comparing selected current densities of the current densities with predetermined electro-migration guidelines.

4. The machine readable medium of claim 1, further comprising:
   selecting at least a portion of the current densities; and
   calculating a Failure-In-Time rate using the selected portion of the current densities.

5. The machine readable medium of claim 1, further comprising parametrically modeling a metal segment current as a function of variables.

6. The machine readable medium of claim 5, further comprising parametrically modeling the metal segment current as a first equation:

$$J_{metal} = J_0 + \sum_{i=1}^{n} k_i P_i,$$

wherein $J_0$ is the current density through the metal segment at a nominal process, interconnect, and voltage and k is the sensitivity of the current density to process, interconnect, and voltage variations.

7. The machine readable medium of claim 6, further comprising performing n+1 simulations to directly characterize the first equation, wherein calculated results statistically predict a point of current density of approximately 3-σ through any metal segment in the parametrically modeled circuit, the calculated results given by a second equation:

$$J_{metal-3-\sigma} = J_0 + 3 \times \sqrt{\left(\sum_{i=1}^{n} k_i^2\right)}.$$

8. The machine readable medium of claim 7 wherein the n+1 simulations comprises approximately twelve simulations.

9. A system of quantifying design risk associated with electro-migration in metal leads of a circuit using computer simulation models, comprising:
   a waveform pre-characterization module to pre-characterize an output current waveform associated with at least one logic cell of the circuit at selected load and input slew points;

an equivalent waveform generation module to estimate an effective load and operating slews at a chip level of the circuit and directly generate an equivalent current source waveform at output;

a current densities evaluation module to evaluate current densities through a metal segment of the circuit using a fast solver;

an interconnect variations model module to parametrically represent process variations and a netlist to parametrically model interconnect variations of the circuit; and a current densities determination module to determine current densities for selected yield numbers using a parametrically generated current source on an interconnect network, wherein calculated results statistically predict a point of current density less than 9–$\sigma$ through any metal segment in the parametrically modeled circuit.

10. The system of claim 9, further comprising a guideline comparison module to compare selected current densities of the current densities with predetermined electro-migration guidelines.

11. The system of claim 10, further comprising:
a current densities selection module to select at least a portion of the current densities; and
a failure-in-time calculation module to calculate a Failure-In-Time rate using the at least a portion of the current densities.

12. The system of claim 9, further comprising:
a metal segment modeling module to parametrically model a metal segment current as a function of variables.

13. The system of claim 12, wherein the metal segment modeling module parametrically models the metal segment current as a first equation:

$$J_{metal} = J_0 + \sum_{i=1}^{n} k_i P_i,$$

wherein $J_0$ is the current density through the metal segment at a nominal process, interconnect, and voltage and k is the sensitivity of the current density to process, interconnect, and voltage variations.

14. The system of claim 13, further comprising a simulation module to perform n+1 simulations to directly characterize the first equation, wherein calculated results statistically predict a point of current density of approximately 3–$\sigma$ through any metal segment in the parametrically modeled circuit, the calculated results given by a second equation:

$$J_{metal-3-\sigma} = J_0 + 3 \times \sqrt{\left(\sum_{i=1}^{n} k_i^2\right)}.$$

15. The system of claim 14, wherein the n+1 simulations comprises approximately twelve simulations.

16. A machine accessible medium compatible with a data processing system for quantification of design risk associated with electro-migration in metal leads of a circuit using computer simulation models, comprising:

a first instruction set to precharacterize an output current waveform for at least one logic cell of the circuit at selected load and input slew points;

a second instruction set integrated with the first instruction set to estimate an effective load and operating slews at a chip level of the circuit and directly generating an equivalent current source waveform at output;

a third instruction set integrated with the first instruction set and the second instruction set to evaluate current densities through a metal segment of the circuit using a fast solver;

a fourth instruction set integrated with the first instruction set, the second instruction set, and the third instruction set to parametrically represent process variations and a netlist to parametrically model the interconnect variations of the circuit; and a fifth instruction set integrated with the first instruction set, the second instruction set, the third instruction set, and the fourth instruction set to determine current densities for selected yield numbers using a parametrically generated current source on an interconnect network, wherein calculated results statistically predict a point of current density less than 9–$\sigma$ through any metal segment in the parametrically modeled circuit.

17. The machine accessible medium of claim 16, wherein the calculated results statistically predict a point of current density of approximately 3–$\sigma$ through any metal segment in the parametrically modeled circuit.

18. The machine accessible medium of claim 16, further comprising a sixth instruction set to parametrically model the metal segment current as a first equation:

$$J_{metal} = J_0 + \sum_{i=1}^{n} k_i P_i,$$

wherein $J_0$ is the current density through the metal segment at a nominal process, interconnect, and voltage and k is the sensitivity of the current density to process, interconnect, and voltage variations.

19. The machine accessible medium of claim 18, further comprising:
a seventh instruction to perform n+1 simulations to directly characterize the first equation, wherein calculated results statistically predict a point of current density of approximately 3–$\sigma$ through any metal segment in the parametrically modeled circuit, the calculated results given by a second equation:

$$J_{metal-3-\sigma} = J_0 + 3 \times \sqrt{\left(\sum_{i=1}^{n} k_i^2\right)}.$$

* * * * *